US007536268B2

(12) United States Patent
Owhadi et al.

(10) Patent No.: US 7,536,268 B2
(45) Date of Patent: May 19, 2009

(54) COLLECTING INFORMATION TO IDENTIFY DEFECTIVE LOCATIONS OF A DISPLAY MONITOR

(75) Inventors: Eric Owhadi, Tomball, TX (US); Christophe Le Rouzo, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 619 days.

(21) Appl. No.: 11/157,572

(22) Filed: Jun. 21, 2005

(65) Prior Publication Data

US 2006/0284644 A1 Dec. 21, 2006

(51) Int. Cl.
*G01R 27/00* (2006.01)
*G01C 9/00* (2006.01)

(52) U.S. Cl. ....................... 702/119; 702/150; 702/155; 348/175; 348/246; 382/194; 250/557; 235/454; 235/462.25

(58) Field of Classification Search ................. 702/119, 702/150, 155; 348/175, 180, 177, 246; 382/194; 250/557; 235/454, 487, 462.25
See application file for complete search history.

(56) References Cited

U.S. PATENT DOCUMENTS

| | | | | |
|---|---|---|---|---|
| 6,111,424 | A | 8/2000 | Bosacchi | |
| 6,438,711 | B2 * | 8/2002 | Woodruff | 714/27 |
| 6,726,103 | B1 | 4/2004 | Motta et al. | |
| 6,947,083 | B2 * | 9/2005 | Nakajima | 348/246 |
| 7,023,470 | B2 * | 4/2006 | Braun | 348/180 |
| 2003/0039403 | A1 * | 2/2003 | Robins | 382/275 |
| 2005/0147287 | A1 * | 7/2005 | Sakai et al. | 382/141 |

FOREIGN PATENT DOCUMENTS

WO WO03/019473 * 6/2003

OTHER PUBLICATIONS

Bruce et al., 'Maintenance and Monitoring Object Models for High Availability Network Appliances', May 2004, IEEE Publication, vol. 50, No. 2, pp. 472-477.*

* cited by examiner

*Primary Examiner*—Edward Raymond
*Assistant Examiner*—Elias Desta

(57) ABSTRACT

Indications of user inputs with respect to a diagnostic image displayed on a display monitor are received to identify defective locations of the display monitor. Information is collected based on the received user inputs that identify defective locations of the display monitor.

19 Claims, 3 Drawing Sheets

COLLECTING INFORMATION TO IDENTIFY DEFECTIVE LOCATIONS OF A DISPLAY MONITOR

BACKGROUND

Display monitors, such as flat panel displays or other types of display monitors, present pictures or images in a display area that is divided into an array of pixels. Typically, in a color display monitor, each pixel is composed of three color elements (e.g., a red element, a blue element, and a green element). Display monitors sometimes have defective pixels, which may be visible to users especially if there are a number of defective pixels in close proximity to each other.

Users who are unhappy with their display monitors may call the customer support department of an organization that made or sold the display monitors. However, it is often difficult for customer support representatives to determine, based on conversations with a user over the telephone, whether a display monitor exhibits sufficient defects to be eligible for replacement or repair under a warranty. A customer support representative can ask the user to describe generally what defects the user sees on the display monitor. The user may even be able to manually count the number of defective pixels that appear on the display monitor. However, the amount of information that can be collected by the customer support representative over the telephone is usually insufficient to enable the customer support representative to accurately determine whether the display monitor violates the technical specification of the display monitor.

Customer support representatives may attempt to ask more specific questions over the telephone. However, asking specific questions to obtain detailed information is usually time consuming. Also, users may not have sufficient knowledge to be able to accurately answer questions. Therefore, customer support representatives generally are unable to accurately determine, based on a telephone conversation or even a text chat session over the Internet, whether a display monitor contains defects that make the display monitor eligible for repair or replacement under a warranty. If customer support representatives allow too many display monitors to be returned for replacement or repair, an organization may incur substantial, unnecessary costs in processing display monitors that should not have been returned to the organization for repair or replacement. On the other hand, if customer support representatives are too restrictive in allowing users to return display monitors for repair or replacement, customers may become dissatisfied, which may result in lost customers or reduced customer loyalty.

DETAILED DESCRIPTION

Figure 1:
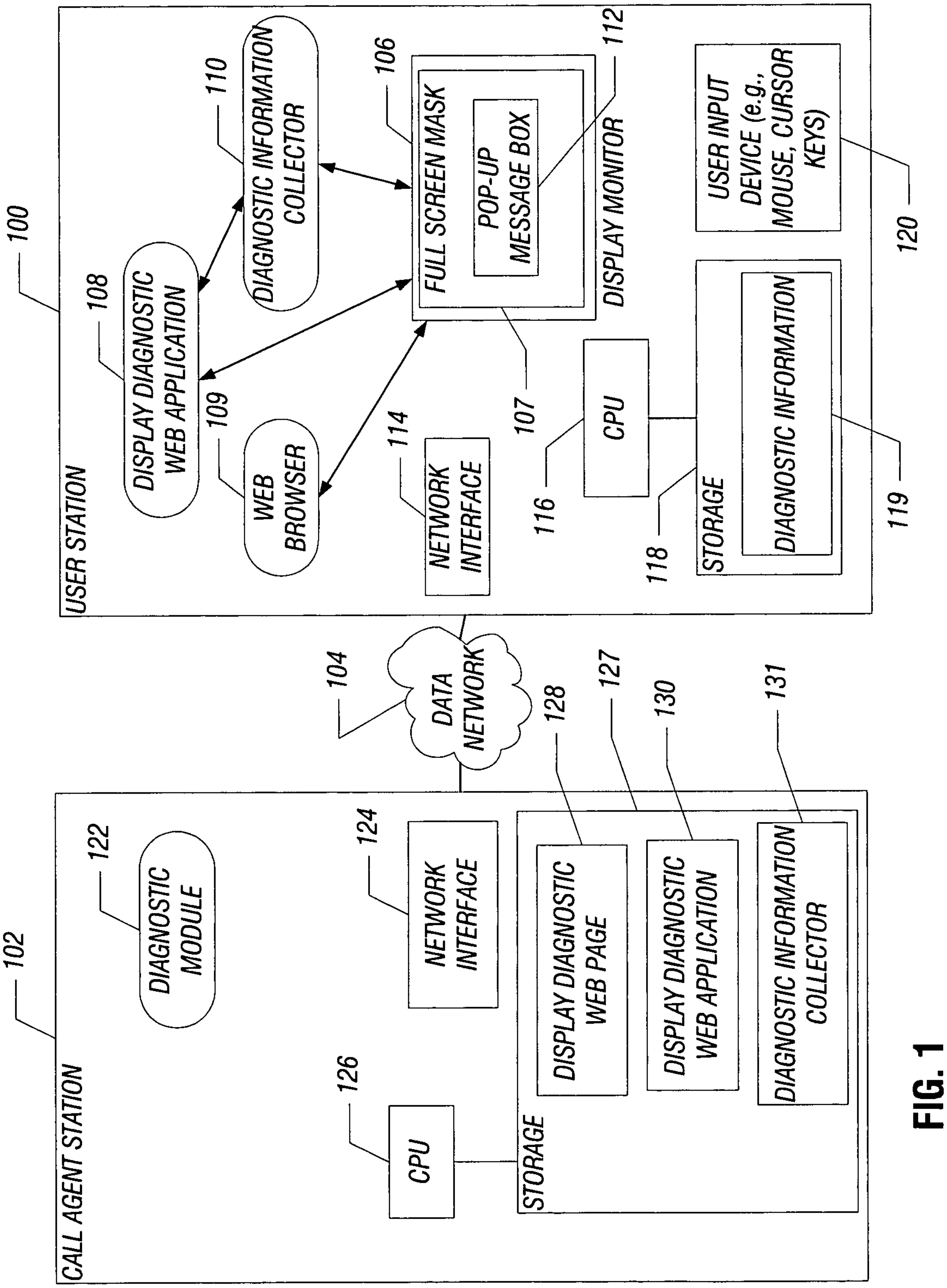
FIG. 1 is a block diagram of an example arrangement of a call agent station and a user station that incorporate an embodiment of the invention.

FIG. 1 illustrates a user station 100 coupled to a call agent station 102 over a data network 104 (e.g., the Internet, a wide area network, a local area network, and so forth). The user station 100 represents the work station of a user (a client system) who may wish to contact a representative at the call agent station 102 (a server system). In one example, the representative is a customer support representative in the customer support department of an organization that sells or makes display monitors, such as display monitor 106 used with the user station 100. Although the terms "call agent station" and "customer support representative" are used in this discussion, it is contemplated that the call agent station 102 can be any station associated with any person that a user can contact to perform diagnosis of the display monitor 106. The term "station" refers to any type of system, such as a computer, personal digital assistant (PDA), or other electronic device, that is able to communicate over a data network (such as network 104) to enable communication of diagnostic information between the call agent station 102 and the user station 100. The call agent station 102 can be coupled to multiple user stations. Also, there may be multiple call agent stations that user stations can access.

Communications between the user at the user station 100 and the representative at the call agent station 102 can include telephone communications over a telephone network (not shown), a text chat session between the user station 100 and call agent station 102 over the data network 104, electronic mail, or some other form of communications. These communications enable the user and representative to discuss problems associated with the display monitor 106 and enable the representative to ask the user questions and to provide instructions to the user.

The user station 100 includes a network interface 114 to enable communications over the data network 104 by the user station 100. Also, the user station 100 includes a central processing unit (CPU) 116 (or plural CPUs) that is (are) coupled to a storage 118 (which can include persistent and/or non-persistent storage devices, such as disk drives, semiconductor memory devices, and so forth).

The user station 100 further includes a display diagnostic web application 108 and a diagnostic information collector 110, which according to one embodiment are software modules executable on the CPU(s) 116. Although shown as being separate modules, the display diagnostic web application 108 and diagnostic information collector 110 can be combined into a single module. More generally, the display diagnostic web application 108 and diagnostic information collector 110 constitute diagnostic modules executable in the user station 100 to perform diagnostic operations with respect to the display monitor 106 in accordance with some embodiments.

For purposes of performing diagnostics on the display monitor 106 to determine if defective pixels cause the display monitor 106 to violate technical specifications of the display monitor, the display diagnostic web application 108 is able to present a series or sequence of diagnostic images or pictures on the display monitor 106. The terms "picture" and "image" are used interchangeably, and refer to any two-dimensional representation of an object (or objects) in the display monitor 106.

Instead of being executed on the user station, the display diagnostic application 108 and/or diagnostic information collector 110 can be executed at a server side, such as at the call agent station 102 or at another server. If executed on the call agent station 102, for example, then the display diagnostic web application 108 is able to cause presentation over the network of a series or sequence of diagnostic images on the display monitor associated with the user station.

In some embodiments, the diagnostic images include solid color images (such as solid red, green, and blue images, although other colors can be used in other implementations). In other embodiments, other types of images (besides solid color images) can be presented on the display monitor 106 for the purpose of diagnosing the display monitor 106. Also, instead of presenting multiple images for diagnostics purposes, a single diagnostic image can be presented in the display monitor 106.

The display area of the display monitor 106 is divided into an array of pixels. If the display monitor 106 is a color display monitor, then each of the pixels is associated with plural color elements (e.g., a red element, a blue element, and a green element). In other implementations, a pixel can be associated with elements having other colors. If the display monitor is a grayscale display monitor, then each pixel is associated with an element (e.g., a number of bits) to provide gray level information. For a grayscale display monitor, instead of presenting a series of solid color images for purposes of display monitor diagnosis, images of different gray levels can be presented instead.

In one embodiment, the series of solid color images displayed on the display monitor 106 by the display diagnostic web application 108 is a series of full screen masks 107 each filling up the entire display area of the display monitor 106. The display diagnostic web application 108 displays multiple solid color full screen masks (of different colors such as red, green, and blue), in sequence, to enable the identification of different types of defects. As examples, the types of defects that can be determined based on the use of the multiple full screen masks include a green element that is stuck on, a red element that is stuck on, a blue element that is stuck on, a green element that is stuck off, a red element that is stuck off, and a blue element that is stuck off.

For each full screen mask 107 displayed by the display monitor 106, the user at the user station 100 is prompted to select locations on the display area of the display monitor 106 that correspond to visible defects. The user selections are collected by the diagnostic information collector 110. When a particular solid color full screen mask 107 is displayed, a user is prompted to select locations on the display area of the display monitor 106 that do not have the expected solid color.

In one example, for a defective pixel where the green element is always off, the defective pixel will appear black when the green full screen mask is displayed in the display monitor 106. If the green element of a defective pixel is stuck on, then the defective pixel will appear as a visible dot when the red full screen mask or blue full screen mask is displayed. Note that the stuck-on green element will not be visible when the green full screen mask is displayed. Similarly, for a pixel that has a blue element stuck off, the pixel will appear as a black dot when the blue full screen mask is displayed. For a pixel where the blue element is stuck on, the pixel will appear as a visible dot when the green or red full screen masks are presented. Also, for a defective pixel that has the red element stuck off, the pixel will appear as a black dot when the red full screen mask is presented. On the other hand, when the red element of the defective pixel is stuck on, then the pixel will appear as a visible dot when the blue or green full screen mask is presented.

The user is prompted, such as by a pop-up message box 112 or by the customer representative in a telephone session, text chat session, or by e-mail, to select pixels that are visible when a particular full screen mask 107 is displayed. The user can make a selection through one or more user input devices 120, which include a mouse, cursor keys of a keyboard, and so forth. Note that the pop-up message box message 112 can be moved around on the display monitor 106 or hidden from view to enable the user to view the entire display area of the display monitor 106 to identify visible dots that correspond to defective pixels. Using a mouse, for example, the user can move a pointer (displayed by the display monitor 106) to a location on the display area that is in close proximity to a visible dot that corresponds to a defective pixel. For finer adjustment of the location of the pointer on the display area, the user can use cursor keys (the up, down, left, right cursor control keys) to move the pointer displayed on the display monitor 106 to the location of the dot that corresponds to the defective pixel. The user can then activate some user input device element (e.g., a specific key on the keyboard, a right or left mouse click button, etc.) to indicate the specific location of the defective pixel.

The user inputs are monitored by the diagnostic information collector 110 by receiving indications of the user inputs. Note that if the diagnostic information collector 110 is executed on a server side, such as at the call agent station 102, then the diagnostic information collector 110 receives the indications of the user inputs over a network from the user station 100. In response to actuation of the specific input element (right or left mouse button, specific key on a keyboard, etc.) that provides an indication of a defective pixel on the display monitor 106, the diagnostic information collector 110 computes the coordinates (e.g., X, Y coordinates identifying the pixel location in the array of pixels) of the defective pixel and stores such coordinates as part of diagnostic information 119 stored in the storage 118. Coordinates are collected for each defective pixel identified by a user for a particular full screen mask 107. Information for the defective pixels identified for each of the multiple full screen masks (of different colors) is collected in the diagnostic information 119. The diagnostic information 119 (including number of defective pixels per full screen mask and coordinates of the defective pixels) is used (at the call agent station 102 or elsewhere) to determine whether the types of defects and locations of such defects warrant a repair or replacement of the display monitor 106.

If the diagnostic information collector 110 is executed on the server side (such as on the call agent station 102), then the diagnostic information 119 would be stored in a storage of the server (such as a storage 127 in the call agent station 102).

After the user provides some indication that the user is done with a particular full screen mask 107, the display diagnostic web application 108 can ask, through the pop-up message box 112, the user to input the number of pixels the user identified as being defective. This number entered by the user is compared to the actual number of defective pixels counted by the diagnostic information collector 110 based on user selection of defective pixels on the display monitor 106.

The display diagnostic web application 108 and diagnostic information collector 110 can be downloaded from the call agent station 102 (or from some other system that is coupled to the data network 104). In one example arrangement, the call agent station 102 includes the storage 127 that stores a display diagnostic web page 128. A user at the user station 100 can access the display diagnostic web page 128 (such as through a web browser 109 in the user station 100). In the web page downloaded from the call agent station 102 to the user station 100 and displayed by the web browser 109, the user can select links (e.g., hyperlinks) displayed in the display diagnostic web page 128 for downloading the display diagnostic web application 130 and diagnostic information collector 131 to the user station 100.

The display diagnostic web application 130 and diagnostic information collector 131 copied from the call agent station 102 to the user station 100 as the display diagnostic web application 108 and diagnostic information collector 110, respectively. Note that the display diagnostic web page 128, display diagnostic web application 130, and diagnostic information collector 131 can be stored on another system, such as a web server or the like, coupled to the data network 104.

The call agent station 102 also includes a CPU 126 (or plural CPUs) and a network interface 124 to enable communication between the call agent station 102 and the user station 100 over the data network 104.

Also, the call agent station 102 includes a display diagnostic module 122 that displays diagnostic information 119 (communicated from the user station 100 to the call agent station 102) to enable the call agent at the call agent station 102 to view the diagnostic information 119. The diagnostic module 122 is also able to examine the diagnostic information 119 and determine, based on diagnostic information 119, whether the display monitor 106 at the user station 100 is defective or not (e.g., whether the defective pixels identified by the user are within or outside a manufacturer-set specification). If the defective pixels are outside the manufacturer-set specification, then that is an indication that the display monitor 106 has to be repaired or replaced. However, if the defective pixels are within specification, then the display monitor 106 does not have to be repaired or replaced.

The factors that are used to determine whether defective pixels of a display monitor are within or outside specification include such factors as the total number of defective pixels, the types of defects (e.g., stuck on or off and which color), relative locations of the pixels (e.g., the distances between any two defective pixels of a particular type), and so forth. For example, the diagnostic module 122 can determine the minimum distance between two pixels where a particular defective color element is stuck on or stuck off, the average distance among the three closest defective pixels where a particular color element is stuck on or stuck off, and so forth. The distances are computed based on the coordinates contained in the diagnostic information 119. The type of defect is determined based on markings of defective pixels made by the user with respect to the plural full screen masks. For example, a green element associated with pixel (X1, Y1) is determined to be stuck on if the user had indicated that pixel (X1, Y1) was a visible dot during display of the red and blue full screen masks but was not a visible dot during display of the green full screen mask.

The algorithm used by the diagnostic module 122 to determine whether defective pixels on the display monitor 106 are within or outside specification can vary by display monitor manufacturer or seller. A manufacturer can specify, for example, that the minimum distance between stuck-off color elements cannot be less than 20 pixels (or some other predefined number of pixels).

Figure 2:
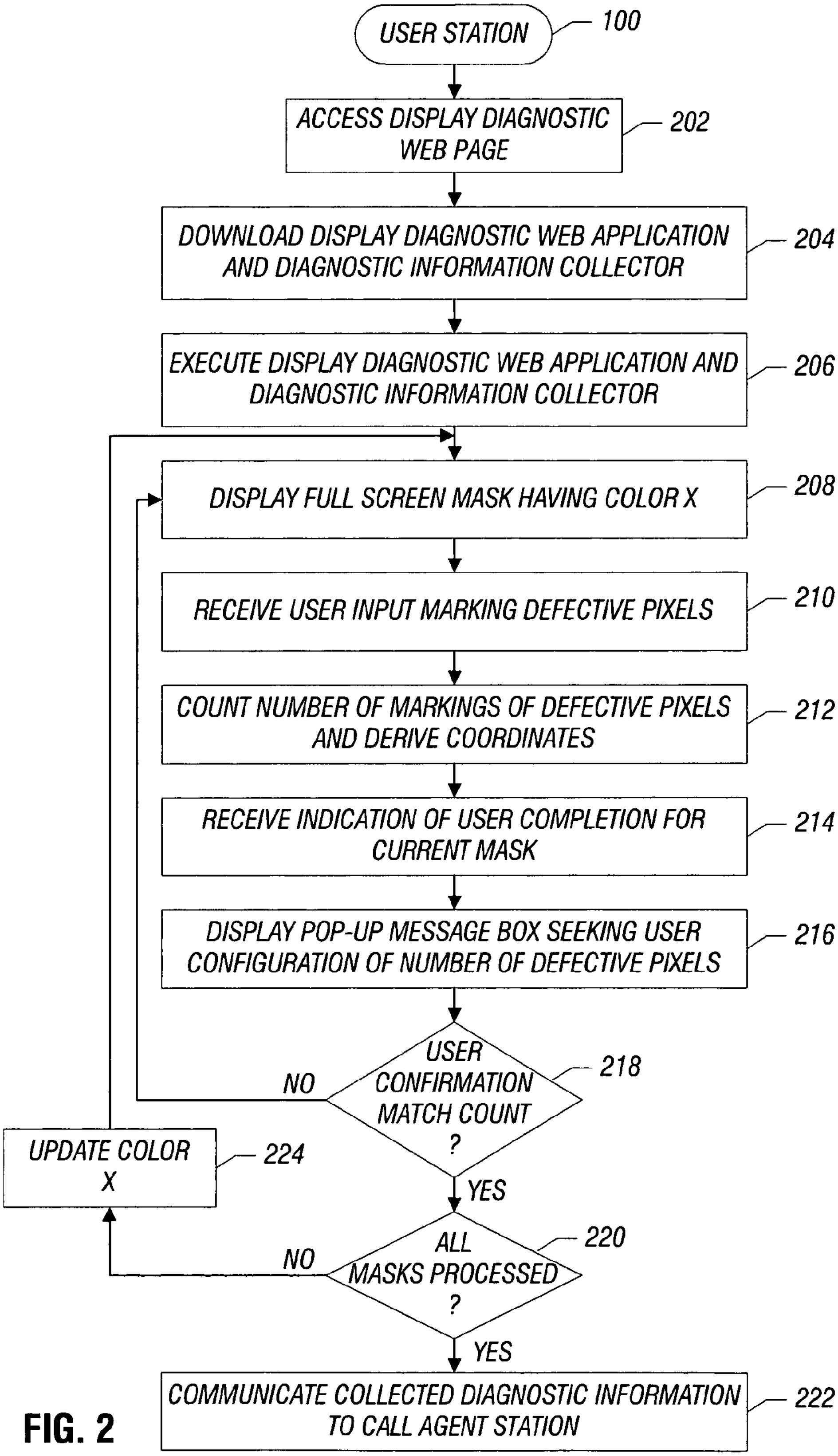
FIG. 2 is a flow diagram of tasks performed in the user station of FIG. 1, according to an embodiment.

FIG. 2 illustrates tasks performed by modules in the user station 100, including the display diagnostic web application 108, diagnostic information collector 110, and web browser 109. Alternatively, the diagnostic web application 108 and/or the diagnostic information collector 110 can be executed on the call agent station 102 or on another server. In response to user input, the web browser 109 accesses (at 202) the display diagnostic web page 128 at the call agent station 102 (or at another system coupled to data network 104). For example, the user may have been directed to the uniform resource locator (URL) of the diagnostic web page 128 by the representative at the call agent station 102, by a user's manual, or by some other technique. In response to user selection, the web browser 109 downloads (at 204) the display diagnostic web application and diagnostic information collector from the storage 127 in the call agent station 102 for execution (at 206) on the user station 100 as the display diagnostic web application 108 and diagnostic information collector 110, respectively.

The display diagnostic web application 108 then displays (at 208) a first full screen mask having a first color (color x, where x can be red, green, or blue, as an example). User inputs are then received (at 210) by the diagnostic information collector 110 marking defective pixels on the full screen mask 107. The diagnostic information collector 110 counts (at 212) the number of markings of defective pixels and derives the coordinates of the indicated defective pixels. The count of the number of defective pixels for the current full screen mask 107 and coordinates of indicated defective pixels are stored as part of the diagnostic information 119 by the diagnostic information collector 110.

The display diagnostic web application 108 receives some indication (at 214) of user completion for the current full screen mask. In response to receiving this indication of user completion for the current full screen mask, the display diagnostic web application 108 displays (at 216) a pop-up message box 112 that seeks user confirmation of the number of defective pixels (where the user is asked to enter a value indicating the number of defective pixels the user marked). If the user confirmation matches the count derived by the diagnostic information collector 110, then the display diagnostic web application 108 can continue to the next task. However, if the user confirmation does not match the count derived by the diagnostic information collector 110, then the display diagnostic web application 108 causes acts 208-216 to be repeated. Alternatively, instead of repeating acts 208-216, the display diagnostic web application 108 can provide a message to the user that the number of defective pixels entered by the user was incorrect, and to ask the user to re-enter the marked number of defective pixels.

Once the user confirmation matches the count derived by the diagnostic information collector 110, the display diagnostic web application 108 determines (at 220) if all full screen masks have been processed. For example, in an implementation where the masks include the red, green, and blue masks, the display diagnostic web application 108 determines if each of these masks has been presented to the user for the purpose of performing diagnostics with respect to the display monitor 106. If not all masks have been processed, the display diagnostic web application 108 updates (at 224) the color x (to a different one of red, blue, or green, for example), and acts 208-216 are repeated for the next full screen mask. However, if all masks have been processed, then the collected diagnostic information 119 stored in the storage 118 of the user station 100 is communicated (at 222) to the call agent station 102 for processing by the call agent station.

Figure 3:
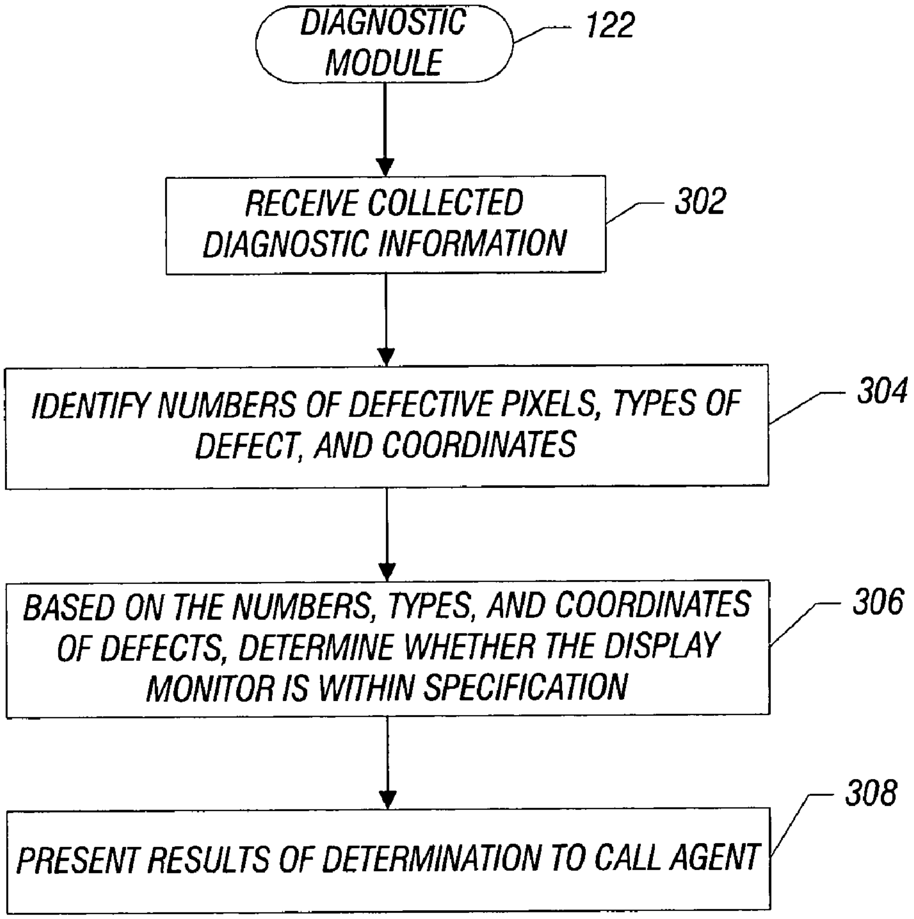
FIG. 3 is a flow diagram of tasks performed by the call agent station of FIG. 1, according to an embodiment.

FIG. 3 shows a process performed by the diagnostic module 122 executable in the call agent station 102. The diagnostic module 122 receives (at 302) the collected diagnostic information 119 from the user station 100. Next, the diagnostic module 122 identifies (at 304) the defective pixels, types of defects, and coordinates of the defects from the diagnostic information 119. Based on the numbers, types, and coordinates of the defective pixels, the diagnostic module 122 determines (at 306) whether the display monitor is within specification.

The results of the determination are presented (at 308) to the representative. Based on the presented results, the representative at the call agent station 102 can inform the user whether the display monitor 106 should be returned for repair or replacement. Alternatively, instead of the representative informing the user, the diagnostic module 122 can provide the notification to the user of whether the display monitor is to be repaired or replaced. Also, instead of the representative determining whether the monitor should be returned for replacement or repair, the representative or diagnostic module 122 can direct the user to a web site or other documentation to enable the user to determine whether the display monitor is within or outside the technical specification of the display monitor.

Thus, according to some embodiments of the invention, a mechanism is provided to accurately and efficiently diagnose whether a display monitor is within specification or not. The ability to accurately diagnose a defective display monitor reduces the likelihood that a display monitor that is within specification is returned for repair or replacement, which can incur extra costs. Also, the mechanism according to some embodiments allows representatives at a customer support department to more quickly determine that a display monitor is within or outside a specification, which reduces labor costs and enhances user satisfaction. Also, in an arrangement where a first company (such as a computer manufacturer) has a relationship with a supplier that supplies the display monitor, the determination of whether a display monitor is defective can be according to the specification set by the supplier, so that any returned display monitor to the computer manufacturer is more likely to be replaced by the supplier to reduce the likelihood that the computer manufacturer is stuck with the cost of repair or replacement.

Also, the diagnostic module 122 in the call agent station 102 can be provided in a fully automated environment, where the user at the user station 100 does not have to interact with a human at the call agent station 102. The diagnostic module 122 can, in an automated manner, provide a recommendation to the user based on input provided by the user with respect to the full screen masks presented by the display diagnostic web application 108 and the diagnostic information collected by the diagnostic information collector 110. This ability to diagnose whether a display monitor is within or outside specification without the use of a customer support representative further reduces costs associated with providing customer support regarding defective products.

To reduce the likelihood of customers providing false information regarding defective pixels on the display monitor 106, a disclaimer can be provided by the display diagnostic web application 108 or verbally by a customer representative. The display monitor 106, if returned for repair or replacement, can be audited to determine if the user has in fact correctly provided accurate information regarding defective pixels. The diagnostic information 119 provided back to the diagnostic module 122 can, for example, contain some type of an identifier (such as a serial number) of the display monitor 106. The identifier can be used as a key to later verify that the diagnostic information 119 collected based on user input matches up with an examination performed by a repair technician.

Instructions of software routines described above (including display diagnostic web application 108, diagnostic information collector 110, and diagnostic module 122 in FIG. 1) are loaded for execution on a processor (e.g., CPUs 116, 126). The processor includes microprocessors, microcontrollers, processor modules or subsystems (including one or more microprocessors or microcontrollers), or other control or computing devices. As used here, a "controller" refers to hardware, software, or a combination thereof. A "controller" can refer to a single component or to plural components (whether software or hardware).

Data and instructions (of the software) are stored in respective storage devices, which are implemented as one or more machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method comprising:

receiving indications of user inputs with respect to a diagnostic image displayed on a display monitor, the indications of user inputs comprising indications of selections of locations of the diagnostic image corresponding to defective pixels of the display monitor;

collecting information based on the received indications of user inputs that comprise indications of selections of locations corresponding to the defective pixels of the display monitor, wherein receiving indications of user inputs with respect to the diagnostic image comprises receiving indications of user inputs with respect to a full screen solid color image; and receiving indications of additional user inputs with respect to additional diagnostic images displayed on the display monitor to identify locations of defective pixels of the display monitor, the additional diagnostic images being full screen solid color images of other colors, wherein collecting the information is further based on the received indications of the additional user inputs.

2. The method of claim 1, further comprising sending the collected information from a first system to a second system for diagnosing the display monitor.

3. The method of claim 1, wherein receiving the indications of selections of locations comprises receiving indications of selections made by a user based on visible dots in the displayed diagnostic image corresponding to defective pixels of the display monitor.

4. The method of claim 1, further comprising determining whether the display monitor violates a technical specification of the display monitor based on the collected information.

5. The method of claim 4, further comprising providing a notification to repair or replace the display monitor in response to determining that the display monitor violates the technical specification.

6. The method of claim 1, wherein the receiving and collecting is performed at one of a user station and a server.

7. A system comprising:

a processor;

one or more diagnostic modules executable on the processor, the one or more diagnostic modules to:

receive indications of user inputs with respect to a diagnostic image displayed on a display monitor, the indications of user inputs comprising indications of selections of locations of the diagnostic image corresponding to defective pixels of the display monitor: and collect information based on the received indications of user inputs comprising indications of selections of locations corresponding to the defective pixels of the display monitor, wherein the diagnostic image comprises a first full screen solid color image, wherein the one or more diagnostic modules are adapted to further:

receive indications of additional user inputs with respect to additional full screen solid color images to identify defective pixels, the additional full screen solid color images having colors different from the first solid color image, wherein collecting the diagnostic information is further based on the received indications of the additional user inputs.

8. The system of claim 7, further comprising a network interface to communicate the diagnostic information over a network to another system.

9. The system of claim 7, wherein defective pixels are visible dots in the first full screen solid color image, wherein the indications of user inputs comprise indications of user selections with respect to the visible dots.

10. A method comprising:

executing a diagnostic module to cause display of a plurality of solid color images of different colors on a display monitor;

receiving indications of user inputs with respect to the displayed plurality of solid color images regarding defective pixels of the display monitor; and collecting diagnostic information based on the received indications of user inputs with respect to the displayed plurality of solid color images, the collected diagnostic information relating to the defective pixels.

11. The method of claim 10 further comprising downloading, by a system having the display monitor, the diagnostic module over a network in response to selection of a link at a web page.

12. The method of claim 10, wherein collecting the diagnostic information comprises storing an indicator of a number of the defective pixels and storing coordinates of the defective pixels.

13. The method of claim 12, further comprising determining whether the display monitor violates a specification of the display monitor based on determining the number of defective pixels and relative locations of the defective pixels.

14. The method of claim 10, further comprising determining, based on the collected diagnostic information, whether the defective pixels contain at least one of green elements that are stuck on, green elements that are stuck off, red elements that are stuck on, red elements that are stuck off, blue elements that are stuck on, and blue elements that are stuck off.

15. An article comprising at least one storage medium containing instructions that when executed cause a system to:

receive diagnostic information containing counts of numbers of defective pixels for respective diagnostic images displayed by a display monitor, the diagnostic information further containing coordinates of defective pixels, the diagnostic information created based on user inputs with respect to the displayed diagnostic images;

determine, based on the diagnostic information, types of defects of the defective pixels;

determine distances between defective pixels; and determine whether the display monitor violates a technical specification of the display monitor based on the determined types of defects and determined distances.

16. The article of claim 15, wherein the display monitor is part of a user station connected to a network, and wherein receiving the diagnostic in formation comprises receiving the diagnostic information from the user station over the network.

17. A system comprising:

means for receiving indications of user inputs with respect to plural full screen solid color images displayed sequentially on a display monitor, the indications of user inputs to identify defective pixels of the display monitor;

means for collecting diagnostic information based on the received indications of user inputs that identify defective pixels of the display monitor; and means for diagnosing whether the display monitor violates a technical specification of the display monitor based on the diagnostic information.

18. A system comprising:

a diagnostic web application to cause sequential presentation of plural full screen masks on a display monitor, the display monitor having an away of pixels, each pixel associated with plural color elements, the plural full screen masks having different colors, wherein pixels having defective color elements are visible when at least one of the plural full screen masks i. displayed;

a diagnostic information collector to receive indications of user selections of locations of a display area of the display monitor responding to pixels having defective color elements; and a storage to store diagnostic information collected based on the received indications of user selections.

19. The method of claim 10, wherein the plurality of solid color images comprise full screen solid color images.

* * * * *

UNITED STATES PATENT AND TRADEMARK OFFICE

CERTIFICATE OF CORRECTION

PATENT NO. : 7,536,268 B2

APPLICATION NO. : 11/157572

DATED : May 19, 2009

INVENTOR(S) : Eric Owhadi et al.

It is certified that error appears in the above-identified patent and that said Letters Patent is hereby corrected as shown below:

In column 10, line 36, in Claim 18, delete “away” and insert -- array --, therefor.

In column 10, line 40, in Claim 18, delete “i.” and insert -- is --, therefor.

In column 10, line 43, in Claim 18, delete “responding” and insert -- corresponding --, therefor.

Signed and Sealed this

Twenty-seventh Day of October, 2009

David J. Kappos

*Director of the United States Patent and Trademark Office*